(12) United States Patent
Posselt

(10) Patent No.: US 8,084,777 B2
(45) Date of Patent: Dec. 27, 2011

(54) LIGHT EMITTING DIODE SOURCE WITH PROTECTIVE BARRIER

(75) Inventor: Jason Posselt, Sunnyvale, CA (US)

(73) Assignee: Bridgelux, Inc., Livermore, CA (US)

( * ) Notice: Subject to any disclaimer, the term of this patent is extended or adjusted under 35 U.S.C. 154(b) by 17 days.

(21) Appl. No.: 12/410,208

(22) Filed: Mar. 24, 2009

(65) Prior Publication Data

US 2010/0142180 A1 Jun. 10, 2010

(51) Int. Cl.
*H01L 33/00* (2010.01)

(52) U.S. Cl. ............ 257/99; 257/81; 257/98; 257/100; 257/433; 257/684; 257/687; 257/709; 257/E21.499; 257/E23.002; 257/E23.003; 257/E23.004; 257/E23.007; 257/E23.008; 438/25; 438/26; 438/29; 438/64; 438/126

(58) Field of Classification Search .............. 257/79, 257/99, 81, 98, 100, 433, 684, 687, 709, 257/E21.499, E23.002, E23.003, E23.004, 257/E23.007, E23.008, E33.058, E33.059, 257/E33.061, E33.072; 438/26, 25, 29, 64, 438/126

See application file for complete search history.

(56) References Cited

U.S. PATENT DOCUMENTS

| 6,274,924 | B1 | 8/2001 | Carey et al. | |
|---|---|---|---|---|
| 7,019,335 | B2 | 3/2006 | Suenaga | |
| 7,176,502 | B2 | 2/2007 | Mazzochette et al. | |
| 2002/0004251 | A1* | 1/2002 | Roberts et al. | 438/26 |
| 2006/0163601 | A1* | 7/2006 | Harle et al. | 257/100 |
| 2008/0185606 | A1* | 8/2008 | Sano et al. | 257/98 |
| 2009/0140285 | A1* | 6/2009 | Lin et al. | 257/100 |

OTHER PUBLICATIONS

PCT/US2010/02626—Notification of transmitttal of the international search report and the written opinion of the international searching authority, or the declaration. Apr. 26, 2010.

* cited by examiner

*Primary Examiner* — Benjamin Sandvik
*Assistant Examiner* — Farid Khan
(74) *Attorney, Agent, or Firm* — Arent Fox LLP

(57) ABSTRACT

An apparatus having a substrate, an LED light source attached to the substrate, an electrical connector attached to the substrate and electrically connected to the LED light source, a potting material on the substrate and covering at least a portion of the electrical connector; and a barrier separating the potting material from the LED light source, the barrier having a height that exceeds the thickness of the potting material on the substrate.

22 Claims, 3 Drawing Sheets

LIGHT EMITTING DIODE SOURCE WITH PROTECTIVE BARRIER

BACKGROUND

1. Field

The present disclosure relates to light emitting devices, and more particularly, to a light emitting diode source with a protective barrier.

2. Background

A light emitting diode (LED) is a semiconductor material impregnated, or doped, with impurities. These impurities add "electrons" and "holes" to the semiconductor, which can move in the material relatively freely. Depending on the kind of impurity, a doped region of the semiconductor can have predominantly electrons or holes, and is referred to as N-type or P-type semiconductor regions, respectively. In LED applications, the semiconductor includes an N-type semiconductor region and a P-type semiconductor region. A reverse electric field is created at the junction between the two regions, which cause the electrons and holes to move away from the junction to form an active region. When a forward voltage sufficient to overcome the reverse electric field is applied across the P-N junction, electrons and holes are forced into the active region and combine. When electrons combine with holes, they fall to lower energy levels and release energy in the form of light.

LEDs have traditionally been packaged in through-hole or surface mount package configurations. An example of a through-hole package includes an LED encased in a cylindrical or dome shaped lens with anode and cathode leads connected to the LED and extending through the bottom of the lens. These LED packages are often mounted to a circuit board with other LED packages and/or electronic components. For example, an LED driver circuit may be mounted to the circuit board and connected to any number of LED packages to provide an LED light source as an incandescent or fluorescent lamp replacement. As another example, various processing components mounted to the circuit board may be connected to an LED package to provide an indication to an observer of some processing condition or state.

An LED package may be mounted to a circuit board and connected to other LED packages and/or electronic components using various electrical connectors. By way of example, an LED package may be connected to a terminal mounted on the circuit board via an electrical trace and one or more other LED packages and/or electronic components may also be connected to the terminal. As another example, the LED package may be connected to one or more other LED packages and/or electronic components via a wire soldered to a pad connected to the LED package by an electrical trace.

In various lighting applications, such as exterior lighting, refrigeration, damp environment, automotive, trucking, and other harsh environments, a potting material may be applied to the circuit board or light source assembly to protect the electronic components, electrical connectors and electrical traces from moisture intrusion. The potting material, however, is not an optical compound, and therefore, should not obstruct the optical path of the light emitted from the LED. If the optical path is obstructed, a significant reduction in light output and/or a change in color of the emitted light may occur.

As LED packages continue to evolve, it has become increasingly more difficult to apply a potting material to a circuit board without detracting from the optical properties of the LED. The trend in LED packaging has been toward thinner and smaller LED packages. In some cases, such as the so called chip on board (COB) or LED Array approach, the package has been significantly minimized or removed completely, resulting in very small form factor packaging with minimum height. Typical methods of applying potting compounds do not work well with such thin packages with minimal protection of the semiconductor chips, resulting in obstructions of the optical path and loss of light. Accordingly, there is a need in the art for improved methods for applying potting material to such packages or modifications to such packages to enable potting without covering the optical emitting area of the LED, especially as package heights continue to decrease.

SUMMARY

In one aspect of the disclosure, an apparatus includes a substrate, an LED light source attached to the substrate, an electrical connector attached to the substrate and electrically connected to the LED light source, a potting material on the substrate and covering at least a portion of the electrical connector, and a barrier separating the potting material from the LED light source, the barrier having a height that exceeds the thickness of the potting material on the substrate.

In another aspect of the disclosure, an apparatus includes a substrate, an LED light source attached to the substrate, a barrier surrounding at least a portion of the LED light source, an electrical connector attached to the substrate and electrically connected to the LED light source, the electrical connector being on the opposite side of the barrier from the LED light source, and a potting material on the substrate and covering at least a portion of the electrical connector, wherein the barrier has a height that exceeds the thickness of the potting on the substrate.

In yet another aspect of the disclosure, an apparatus includes a substrate, an LED light source attached to the substrate, an electrical connector attached to the substrate and electrically connected to the LED light source, a potting material on the substrate and covering at least a portion of the electrical connector, and a barrier between the LED light source and the electrical connector, the barrier having a height that exceeds the thickness of the potting material on the substrate.

In a further aspect of the disclosure, an apparatus includes a substrate, an LED light source attached to the substrate, an electrical connector attached to the substrate and electrically connected to the LED light source, a potting material on the substrate and covering at least a portion of the electrical connector, and means for preventing the potting material from obstructing light emitted from the LED light source.

It is understood that other aspects of the present invention will become readily apparent to those skilled in the art from the following detailed description, wherein it is shown and described only exemplary configurations of an LED light source. As will be realized, the present invention includes other and different aspects of an LED light source and its several details are capable of modification in various other respects, all without departing from the spirit and scope of the present invention. Accordingly, the drawings and the detailed description are to be regarded as illustrative in nature and not as restrictive.

BRIEF DESCRIPTION OF THE FIGURES

Various aspects of the present invention are illustrated by way of example, and not by way of limitation, in the accompanying drawings, wherein.

DETAILED DESCRIPTION

Figure 1:
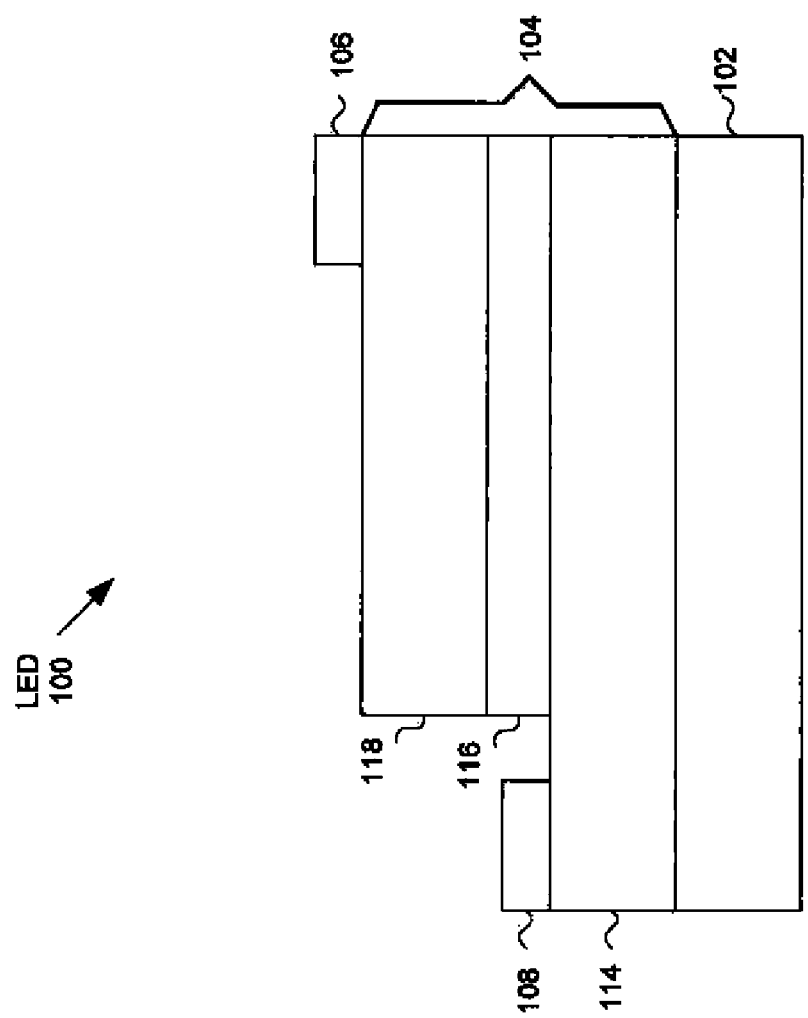
FIG. 1 is a conceptual cross-sectional view illustrating an example of an LED.

The present invention is described more fully hereinafter with reference to the accompanying drawings, in which various aspects of the present invention are shown. This invention, however, may be embodied in many different forms and should not be construed as limited to the various aspects of the present invention presented throughout this disclosure. Rather, these aspects are provided so that this disclosure will be thorough and complete, and will fully convey the scope of the present invention to those skilled in the art. The various aspects of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method.

Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present invention.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be fiber understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower", can therefore, encompass both an orientation of "lower" and "upper," depending of the particular orientation of the apparatus. Similarly, if an apparatus in the drawing is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Various aspects of the present invention will now be presented in connection with an LED light source mounted onto a substrate (e.g., circuit board) with a potting material applied to the electrical traces and connectors. As those skilled in the art will readily appreciate, these aspects are well suited for such applications, but may also be extended to others LED light sources. Accordingly, any reference to a specific configuration or embodiment is intended only to illustrate various aspects of the present invention with the understanding that such aspects have a wide range of applications.

The LED is well known in the art, and therefore, will only briefly be discussed to provide a complete description of the invention. FIG. 1 is a conceptual cross-sectional view illustrating an example of an LED. In this example, the LED 100 includes a substrate 102, an epitaxial-layer structure 104 on the substrate 102, and a pair of electrodes 106 and 108 on the epitaxial-layer structure 104.

The epitaxial-layer structure 104 comprises an active layer 116 sandwiched between two oppositely doped epitaxial layers. In this example, an N-type semiconductor layer 114 is formed on the substrate 102 and a P-type semiconductor layer 118 is formed on the active layer 116, however, the layers may be reversed. That is, the P-type semiconductor layer 118 may be formed on the substrate 102 and the N-type semiconductor layer 114 may formed on the active layer 116. As those skilled in the art will readily appreciate, the various concepts described throughout this disclosure may be extended to any suitable epitaxial-layer structure. Additional layers (not shown) may also be included in the epitaxial-layer structure 104, including but not limited to buffer, nucleation, contact and current spreading layers as well as light extraction layers.

The electrodes 106 and 108 may be formed on the surface of the epitaxial-layer structure 104. The P-type semiconductor layer 118 is exposed at the top surface, and therefore, the P-type electrode 106 may be readily formed thereon. However, the N-type semiconductor layer 114 is buried beneath the P-type semiconductor layer 118 and the active layer 116. Accordingly, to form the N-type electrode 108 on the N-type semiconductor layer 114, a cutout area or "mesa" is formed by removing a portion of the active layer 116 and the P-type semiconductor layer 118 to expose the N-type semiconductor layer 114 therebeneath. After this portion of the epitaxial-layer structure 104 is removed, the N-type electrode 108 may be formed.

Figure 2:
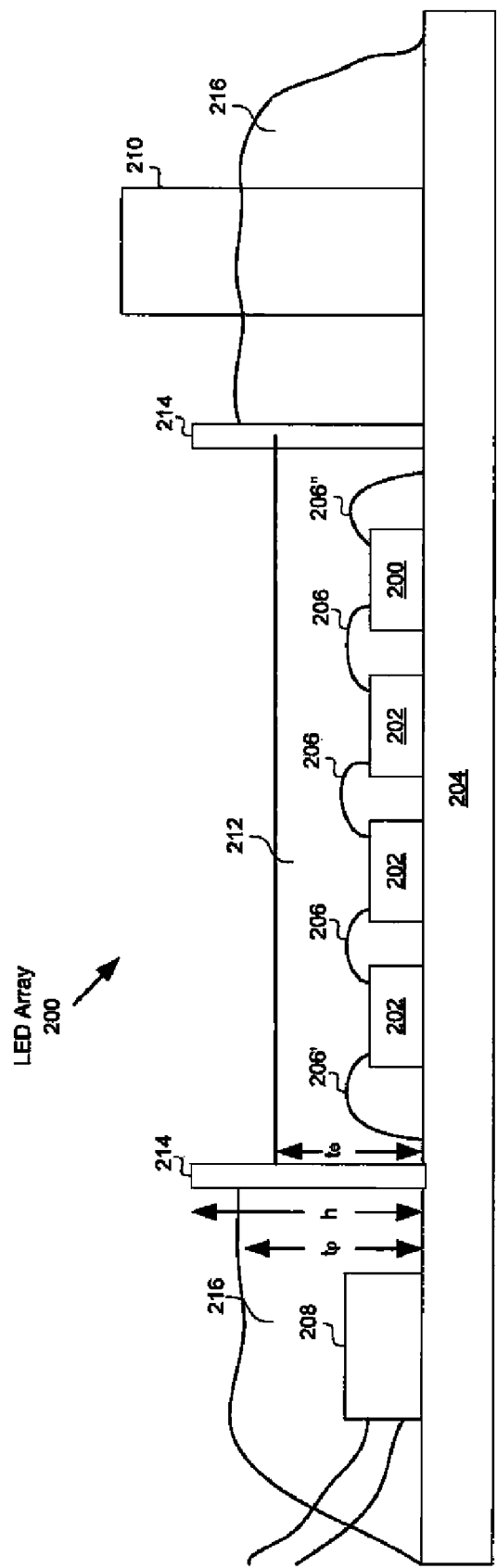
FIG. 2 is a conceptual cross-sectional view of an LED light source with a protective barrier.

An LED light source mounted onto a substrate (e.g., circuit board) will now be presented with reference to FIG. 2. In this example, the LED light source is an LED array 200, which is constructed by mounting a plurality of LEDs 202 onto a substrate 204 and connecting them together in a series and/or parallel fashion with wires 206. The substrate 204 may be a circuit board produced from either a conductive material (such as a metal core printed circuit board, or MCPCB), a standard non-conductive material, a ceramic substrate or other material system. In the configuration shown in FIG. 2, the LED array 200 is electrically connected to traces on the substrate 204 with one wire 206' connected to a bonding pad (not shown) having an electrical trace (not shown) that extends to a solder pad 208 and another wire 206" connected to another bonding pad (not shown) having an electrical trace (not shown) that extends to a terminal 210. Alternatively, both wires 206' and 206" could both be connected to solder pads (one for anode and one for cathode connection) or could both be connected to a terminal with separate anode and cathode connections. Alternatively, both wires 206' and 206" could be connected to flexible or rigid electrical leads (not shown) that extend to solder pads or terminals, either directly or via electrical traces. The electrical leads can be configured in many different geometries, and may either be flat or produced into a formed lead which may be suitable for a variety of mounting and electrical interconnection methods.

The LEDs 202 may have the structure described above in connection with FIG. 1, or some other suitable structure. By way of example, the LEDs may have a flip-chip structure that can be mounted directly onto the substrate 204 in a face down configuration with electrical connections being achieved through conductive bumps built on the surface of the LEDs. As such, the wire bonding process may be eliminated with an array of flip-chip LEDs because the conductive bumps can be mounted directly to bond pads on the substrate 204.

Optionally, the LED array 200 may be encapsulated in an encapsulation material, such as an epoxy, silicone, or other transparent encapsulation material. The encapsulation material 212 may be used to focus the light emitted from the LEDs 202, as well as protect the LEDs 202 and wires 206 that connect them.

A white light source may be constructed from an array of blue LEDs 202 encapsulated with a phosphor material. The phosphor-based encapsulation material 212 may include, by way of example, phosphor particles suspended in a silicone or epoxy carrier or be constructed from a soluble phosphor that is dissolved in the carrier. In this example, blue light emitted from the LEDs 202 excites the phosphor at a high energy level and the phosphor downconverts the light to a lower energy yellow light. The ratio of blue to yellow light may be chosen such that the light emitted from the LED array 200 appears to be white, thus creating a suitable replacement for conventional incandescent and fluorescent light sources. The present invention may be practiced with other LED and phosphor combinations to produce different color lights.

Figure 3:
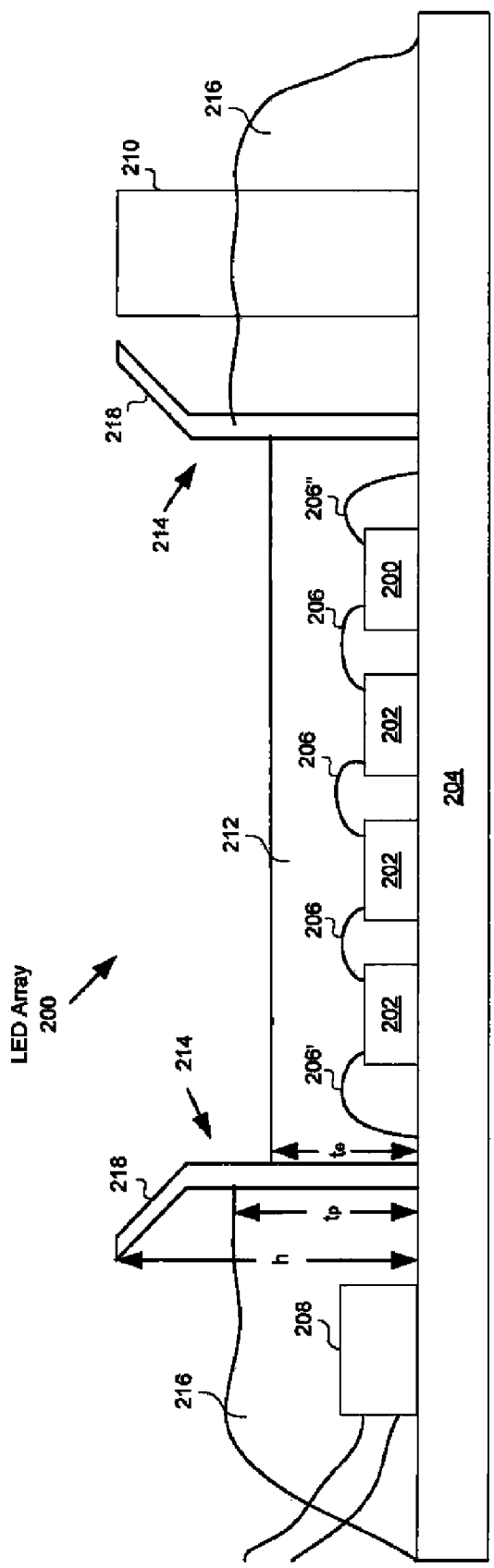
FIG. 3 is a conceptual cross-sectional view of an LED light source with a protective barrier configured to assist in shaping a beam of light emitted from the LED light source.

The LED array 200 is bound by a barrier 214 that is configured to protect the light emitting area from a potting material 216. The barrier 214 may be plastic, silicone, metal, or any other suitable material. In one configuration, the barrier 214 may have a reflective coating to increase the light output of the LED array 200. The barrier 214 may be formed separate from the substrate 204 using a suitable mold or stamped out of sheet material. When formed separately, the barrier 214 may be attached to the substrate 204 using an adhesive or some other suitable means, either before or after the LED array 200 is mounted to the substrate 204. Alternatively, the barrier 214 may be grown or molded directly on the substrate 204. The barrier 214 may be circular, rectangular, oval, or any other suitable shape. The barrier 214 may be normal to the substrate 204 or extend from the substrate 204 at an angle. The barrier 214 may also have a shape that further assists in protecting the light emitting area from the potting material 216, as shown in FIG. 3. Referring to FIG. 3, the barrier 214 may have a lip 218 that extends outward over the potting material 216. The barrier 214 may also be used to assist in directing the light, shaping the beam emitted from the LED array 200.

The height h of the barrier 214 is sufficient to protect the light emitting area from the moisture potting material 216. More specifically, the height h of the barrier 214 exceeds the thickness $t_p$ of the potting material 216, thus preventing any overflow onto the LED array 200 during the application process. In one configuration, the height h of the barrier 214 exceeds the thickness $t_e$ of the encapsulation material 212 as shown in FIGS. 2 and 3. In an alternative configuration, the thickness $t_e$ of the encapsulation material 212 may be increased or a secondary lens (not shown) may be formed within the barrier 214.

The potting material 216 may be any suitable material now known or later discovered. The potting material 216 may be dispensed outside the barrier 214 to protect the solder pad 208, the terminal 210, and the electrical traces (not shown) from the solder pad 208 and terminal 210 to the LED array 200. The potting material 216 may be dispensed using a needle and syringe, or by some other suitable means. The moisture potting material 216 may then be cured to remove impurities and yield a hardened product.

The various aspects of this disclosure are provided to enable one of ordinary skill in the art to practice the present invention. Various modifications to those aspects presented throughout this disclosure will be readily apparent to those skilled in the art, and the concepts disclosed herein may be extended to other LED light source configurations. Thus, the clams are not intended to be limited to the various aspects of this disclosure, but are to be accorded the full scope consistent with the language of the claims. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An apparatus, comprising:
   a substrate having a top surface;
   a LED light source attached to the top surface of the substrate;
   at least one electrical connector attached to the substrate and electrically connected to the LED light Source;
   a potting material disposed on the top surface of the substrate and covering at least a portion of the electrical connector, and metallic traces on the substrate;
   an encapsulation material on the top surface of the substrate and covering at least a portion of the LED light source but not on any part of the potting material; and
   a barrier on the top surface of the substrate separating the potting material from the LED light source, the barrier having a height that exceeds the maximum thickness of the entire potting material on the substrate, the barrier further separating the potting material and the encapsulation material.

2. The apparatus of claim 1 wherein the LED light source comprises an LED array.

3. The apparatus of claim 1 wherein the LED light source comprises at least one LED encapsulated with the encapsulation material.

4. The apparatus of claim 3 wherein the height of the barrier exceeds the maximum thickness of the encapsulation material, and wherein the space between the barriers is entirely covered by the encapsulation material, and wherein no other encapsulating or covering materials are disposed over said encapsulation material.

5. The apparatus of claim 3 wherein each of said at least one LED comprises a blue LED and the encapsulation material includes phosphor.

6. The apparatus of claim 1 wherein the barrier comprises a rim that extends away from the encapsulation material and outwards towards the potting material and extends over at least a part of the potting material.

7. The apparatus of claim 1 wherein the barrier includes a reflective surface arranged to reflect light emitted from the LED light source.

8. An apparatus, comprising:
a substrate having a top surface;
an LED light source attached to the top surface of the substrate;
a barrier surrounding at least at least a portion of the light source on the top surface of the substrate;
at least one electrical connector attached to the substrate and electrically connected to the LED light source; the electrical connector being on the opposite side of the barrier from the LED light source;
a potting material disposed on the top surface of the substrate and covering at least a portion of the electrical connector, and metallic traces on the substrate;
an encapsulation material disposed on the top surface of the substrate and covering at least a portion of the LED light source; and
wherein the barrier has a height that exceeds the maximum thickness of the entire potting material on the substrate; and wherein the barrier completely separates the potting material and the encapsulation material.

9. The apparatus of claim 8 wherein the LED light source comprises an LED array.

10. The apparatus of claim 8 wherein the LED light source comprises at least one LED encapsulated with the encapsulation material.

11. The apparatus of claim 10 wherein the height of the barrier exceeds the maximum thickness of the encapsulation material, and wherein the space between the barriers is entirely covered by the encapsulation material, and wherein no other encapsulating or covering materials are disposed over said encapsulation material.

12. The apparatus of claim 10 wherein each of said at least one LED comprises a blue LED and the encapsulation material includes phosphor.

13. The apparatus of claim 8 wherein the barrier comprises a rim that extends away from the encapsulation material and outwards towards the potting material and extends over at least a part of the potting material.

14. The apparatus of claim 8 wherein the barrier includes a reflective surface arranged to reflect light emitted from the LED light source.

15. An apparatus, comprising:
a substrate having a top surface;
an LED light source attached to the top surface of the substrate;
at least one electrical connector attached to the substrate and electrically connected to the LED light source;
a potting material disposed on the top surface of the substrate and covering at least a portion of the electrical connector, and metallic traces on the substrate;
an encapsulation material disposed on the top surface of the substrate and covering at least a portion of the LED light source; and
a barrier between the LED light source and the electrical connector, the barrier having a height that exceeds the maximum thickness of the entire potting material on the substrate, and wherein the barrier separates the potting material and the encapsulation material.

16. The apparatus of claim 15 wherein the LED light source comprises an LED array.

17. The apparatus of claim 15 wherein the LED light source comprises at least one LED encapsulated in the encapsulation material.

18. The apparatus of claim 17 wherein the height of the barrier exceeds the maximum thickness of the encapsulation material, and wherein the space between the barriers is entirely covered by the encapsulation material, and wherein no other encapsulating or covering materials are disposed over said encapsulation material.

19. The apparatus of claim 17 wherein each of said at least one LED comprises a blue LED and the encapsulation material includes phosphor.

20. The apparatus of claim 15 wherein the barrier includes a reflective surface arranged to reflect light emitted from the LED light source.

21. The apparatus of claim 1, wherein the barrier is formed directly on the substrate.

22. The apparatus of claim 1, wherein the barrier is formed separately from the substrate.

* * * * *